United States Patent [19]

Therssen

[11] Patent Number: 5,450,028
[45] Date of Patent: Sep. 12, 1995

[54] DISCRETE-TIME SIGNAL PROCESSING SYSTEM

[75] Inventor: Dieter E. M. Therssen, Leuven, Belgium

[73] Assignee: U.S. Philips Corporation, New York, N.Y.

[21] Appl. No.: 152,568

[22] Filed: Nov. 12, 1993

[30] Foreign Application Priority Data

Nov. 13, 1992 [EP] European Pat. Off. ......... 922034871

[51] Int. Cl.⁶ .............................................. G11C 27/02
[52] U.S. Cl. ....................................... 327/91; 327/94; 327/95; 327/115; 327/124
[58] Field of Search ............... 307/240, 268, 271, 352, 307/353; 328/151; 327/91, 94, 95, 113, 114, 115, 117, 124

[56] References Cited

U.S. PATENT DOCUMENTS

| | | | |
|---|---|---|---|
| 3,525,047 | 8/1970 | Schwartz | 307/352 |
| 3,697,781 | 10/1971 | McLean | 307/352 |
| 4,150,310 | 4/1979 | Emile, Jr. | 307/353 |
| 4,223,180 | 9/1980 | Eckels | 307/352 |
| 4,366,399 | 12/1982 | Furuhata | 307/352 |
| 4,600,303 | 7/1986 | Mogensen | 307/352 |
| 4,775,811 | 10/1988 | Okano | 307/352 |
| 4,973,975 | 11/1990 | Yamazaki et al. | 307/353 |
| 5,157,343 | 10/1992 | Voorman | 329/319 |
| 5,180,931 | 1/1993 | Harada | 307/353 |
| 5,202,586 | 4/1993 | Hori et al. | 307/352 |
| 5,260,670 | 11/1993 | Ainsworth et al. | 328/151 |

FOREIGN PATENT DOCUMENTS 0512619  11/1992  European Pat. Off.

*Primary Examiner*—Terry D. Cunningham
*Attorney, Agent, or Firm*—Bernard Franzblau

[57] ABSTRACT

A discrete-time signal processing system includes a signal sampling circuit controlled by a sampling signal generator in which a clock signal is derived from an oscillation signal having a higher frequency by means of a switchable frequency divider which is driven by a sigma-delta modulator. By alternately switching from one dividend n to the other dividend n+1 and vice versa, an effective dividend m, where $n \leq m \leq n+1$, is realized, so that a very fine frequency tuning can take place. The use of the $\Sigma$-$\Delta$ modulator is advantageous in that the frequency spectrum of the sampled signal is not corrupted by the frequency spectrum of the sampling signal (clock signal) generated by way of the switching frequency divider.

21 Claims, 2 Drawing Sheets

DISCRETE-TIME SIGNAL PROCESSING SYSTEM

BACKGROUND OF THE INVENTION

This invention relates to a discrete-time signal processing system comprising a signal sampling circuit and a sampling signal generator whose sampling frequency is adjustable, the sampling signal generator including an oscillator for generating a signal which has a fixed frequency, and a frequency divider.

In discrete-time signal processing circuits the sampling frequency for sampling an analog or digital input signal to be processed is often generated by converting, by means of a frequency divider, a high-frequency output signal of an oscillator into a sampling signal (clock signal) having a lower frequency. Needless to observe that the oscillation frequency of the oscillator should to be accurate and stable, which is mostly achieved by the use of a crystal oscillator. The above means that the sampling frequencies are restricted to $f_{osc}/n$ where $f_{osc}$ is the oscillation frequency and n the dividend of the frequency divider. If the oscillation frequency $f_{osc}$ is relatively low compared to the clock frequency, this denotes that the clock frequency can be adjusted only in coarse steps. Conversely, if a specific clock frequency is desired, the choice of the frequency, divider will then determine the oscillation frequency which in many cases does not correspond to the frequencies of the oscillator crystals which are commercially available (and thus cost effective). Furthermore, it may happen that more than one sampling frequency is necessary, such as, for example, in sampling frequency converters. This would require two (precision) oscillators, which is more expensive and more cumbersome compared to a circuit comprising a single oscillator.

SUMMARY OF THE INVENTION

It is an object of the invention to provide a discrete-time signal processing system in which, starting from a single stable oscillator frequency, a clock signal having a desired frequency is available, the ratio between the oscillator frequency and the clock frequency not being restricted to integers.

It is a further object of the invention to provide a discrete-time signal processing system in which the frequency spectrum of the sampled signal is not corrupted by the frequency spectrum of the sampling signal (clock signal).

It is a further object of the invention to provide a discrete-time signal processing system in which more than one desired clock frequency are derived from a fixed oscillator frequency, the ratio between oscillator frequency and clock frequency not being restricted to integers.

A discrete-time signal processing system according to the invention is characterized in that the frequency divider is switchable between at least two states, in a first state the dividend of the frequency divider being n (n=integer) and in a second state the dividend being k, where $k \geq n+x$, where x is an integer and $\geq 1$, and in that a control input of the frequency divider for switching the frequency divider from one state to the other is connected to an output of a sigma-delta modulator ($\Sigma$-$\Delta$ modulator) which is supplied with a control signal for realising an effective dividend m, where $n \leq m \leq k$.

The discrete-time signal processing system according to the invention makes it possible to select, with a high degree of freedom, a sampling frequency which is derived from a higher clock frequency, whereas the sampling frequency is not restricted to a number of integer dividends.

If, with a given oscillator frequency, the dividends n and k are suitably selected, usually n and n+1, a sampling signal can be generated with a desired frequency so that its frequency spectrum is such that the frequency spectrum of the sampled signal is not corrupted by the spectrum of the sampling signal.

BRIEF DESCRIPTION OF THE DRAWINGS

The invention will be further explained with reference to the embodiments represented in the accompanying drawing, in which.

DESCRIPTION OF THE PREFERRED EMBODIMENTS

Figure 1:
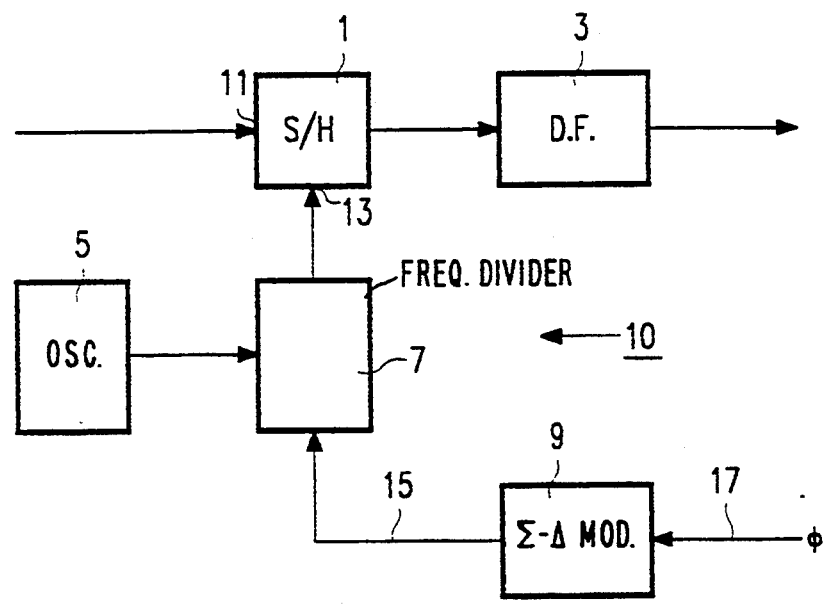
FIG. 1 shows in a block diagram a discrete-time signal processing system according to the invention.

FIG. 1 shows a discrete-time signal processing system 10 according to the invention, comprising a sample-and-hold circuit 1, a decimation filter 3 connected thereto, an oscillator 5, an adjustable frequency divider 7 and a sigma-delta modulator 9 (to be denoted $\Sigma$-$\Delta$ modulator hereinafter). The sample-and-hold circuit 1 receives at its input 11 a signal to be sampled and receives at a control input 13 a sampling signal, i.e. a clock signal which is generated by means of the oscillator 5, the frequency divider 7 and the $\Sigma$-$\Delta$ modulator 9. The signal sampled by the sample-and-hold circuit 1 is further processed by the decimation filter 3.

The sampling signal to be applied to the sample-and-hold circuit 1 has a frequency which is obtained by alternately dividing the oscillation signal of the oscillator 5 in the frequency divider by either a first dividend n or a second dividend $k=n+x$. As a result, the ratio m between the oscillation frequency and the sampling frequency may be situated between n and n+x (or is equal to either n or n+x if the frequency divider is not switched over). The switch-over takes place under the control of the output signal on output 15 of the $\Sigma$-$\Delta$ modulator 9 which thereto receives a control signal $\phi$ at the input 17. This control signal $\phi$ may be a DC signal or a digital signal which may be one bit or more bits in width.

Figure 2:
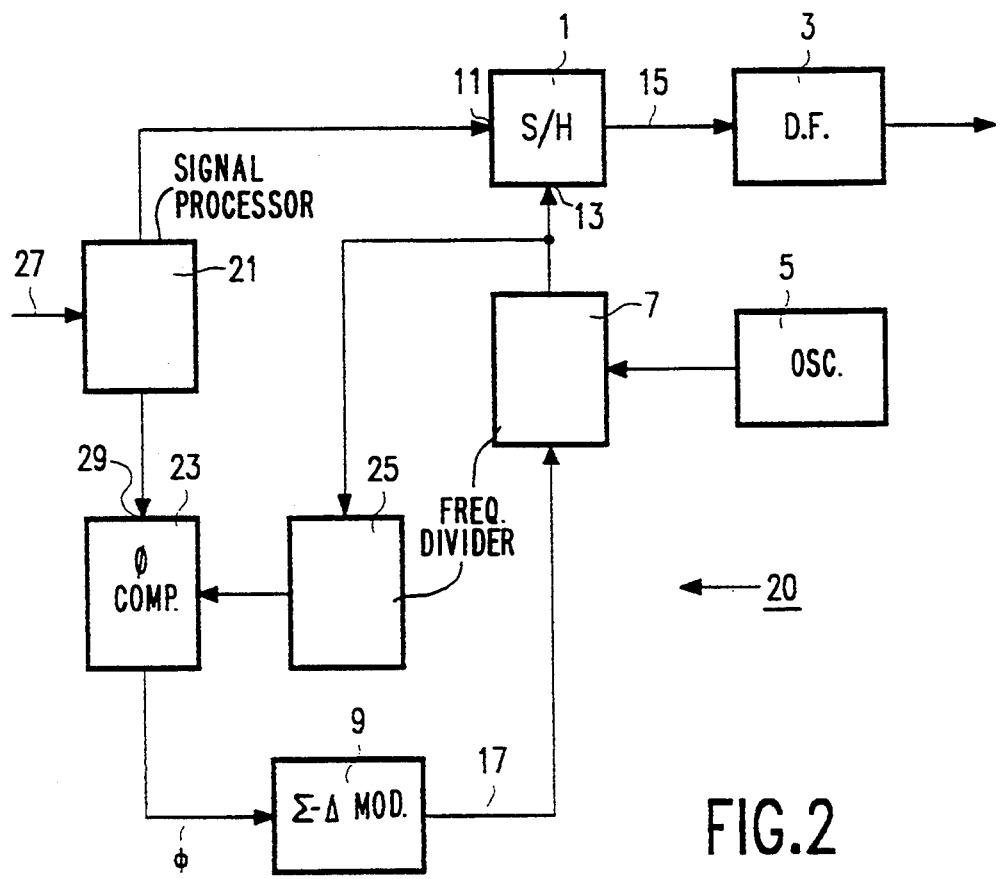
FIG. 2 shows a block diagram of a preferred embodiment of a discrete-time signal processing system according to the invention.

FIG. 2 shows a preferred embodiment of a discrete-time signal processing system 20 according to the invention. The system 20 comprises an input signal processor 21 and a phase comparator 23 in addition to the components 1, 3, 5, 7 and 9 described with reference to FIG. 1 and having like functions in FIG. 2. The input signal processor 2 1 extracts from a radio stereo signal received on input 27 the audio component, which is applied to the sample-and-hold circuit 1, and the 19 kHz pilot tone, which is applied to the input 29 of the phase comparator 23. The phase comparator 23 further receives through a divide-by-two divider 25 the output signal of the frequency divider 7 and forms from these two signals the control signal $\phi$ for the $\Sigma$-$\Delta$ modulator 9.

Figure 3:
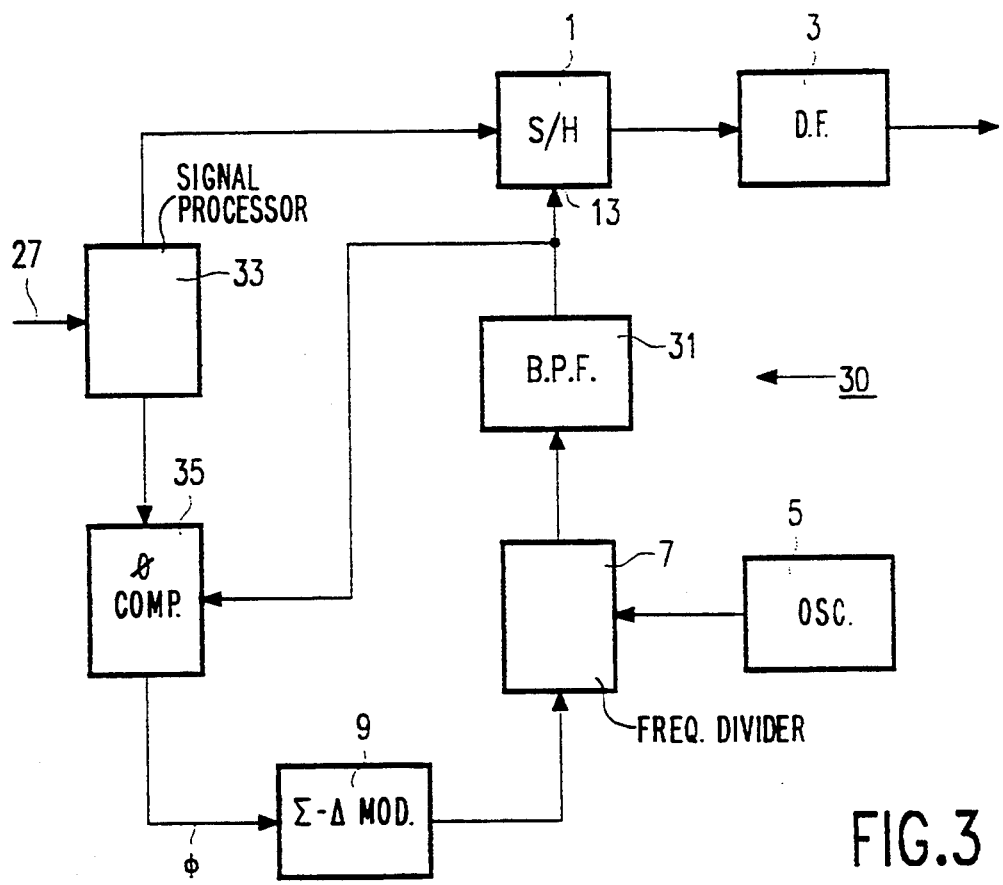
FIG. 3 shows a block diagram of a further embodiment of a discrete-time signal processing system according to the invention.

A further embodiment of a discrete-time signal processing system 30 according to the invention is shown in FIG. 3, in which all of the components corresponding to those of FIG. 2 have like reference numbers and like functions. However, between the frequency divider 7 and the input 13 of the sample-and-hold circuit 1, a bandpass filter 31 is inserted, which passes a frequency band around the desired sampling frequency. This achieves an additional reduction of the high-frequency phase-noise in the sampled signal on the control input 13 of the sample-and-hold circuit 1. The bandpass filter 31 may be arranged as an analog bandpass filter, for example, a ceramic filter, or as an analog phase locked loop, by which loop a large control range can be covered in a relatively simple and cost-effective manner. The signal passed by the bandpass filter 31 is applied to a phase comparator 35. Furthermore, an input signal processor 33 is provided which extracts from a received stereo signal the audio component, which is applied to the sample-and-hold circuit 1, and derives from the 19 kHz pilot tone the double frequency signal (38 kHz) which is applied to a phase comparator 35. The phase comparator 35 applies a control signal $\phi$ to the $\Sigma$-$\Delta$ modulator 9.

Figure 4:
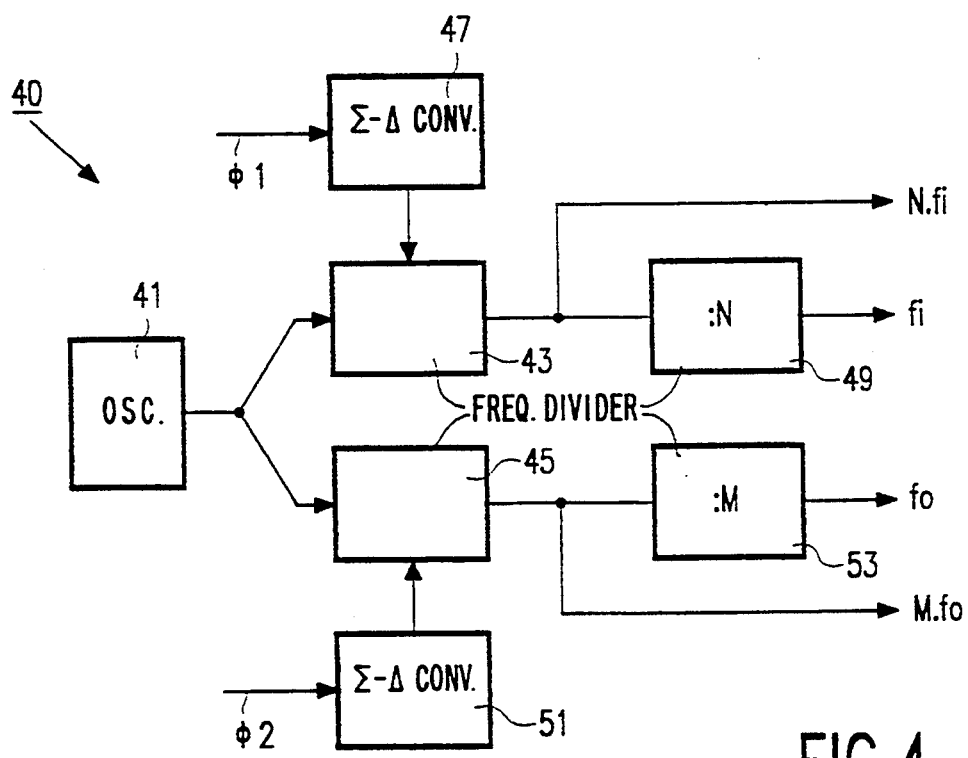
FIG. 4 shows a block diagram of part of a discrete-time signal processing system suitable for a sampling frequency converter.

FIG. 4 shows a further embodiment of the invention which is pre-eminently suitable for use in a sampling frequency converter. In sampling frequency converters the sampling frequency $f_i$ for the incoming signal differs from the sampling frequency $f_o$ for the outgoing signal. Depending on the embodiment of the sampling frequency converter, an input clock frequency $f_i$, a multiple thereof, i.e. a clock frequency $N.f_i$, as well as an output clock frequency $f_o$, is necessary, or an input clock frequency $f_i$, an output clock frequency $f_o$, and a multiple thereof, i.e. clock frequency $M.f_o$. The embodiment 40 shown in FIG. 4 comprises a single (crystal) oscillator 41 whose output signal is applied with the frequency $f_{osc}$ to two frequency dividers 43 and 45. The two frequency dividers 43 and 45 are adjustable as regards their dividend i and ii respectively, where $n \leq i \leq n+x$ and $m \leq ii \leq m+y$, where n, m, x and y are positive integers. The adjustment, in this case the division by either n or n+x and either m or m+y by the frequency dividers 43 and 45 respectively, is determined by the output signal of the $\Sigma$-$\Delta$ converters 47 and 51 respectively, which thereto receive an input signal $\phi 1$ and $\phi 2$, respectively. The output signals of the frequency dividers 43 and 45 have a frequency $N.f_i$ and $M.f_o$ respectively, so that the following holds: $f_{osc} = i.N.f_i = ii.M.f_o$. The output signals $N.f_i$ and $M.f_o$ are divided by further frequency dividers 49 and 53, respectively, by a dividend N and M, respectively, so that output signals are obtained having the respective desired frequency $f_i$ and $f_o$. It should be observed that also the dividends N and M, although being positive integers in this example, need not of necessity be integers considering the above. It should be noted that a sampling frequency converter has been described in a prepublished European Patent Application EP-A-0 512 619.

I claim:

1. Discrete-time signal processing system comprising: a signal sampling circuit having a signal input and a control input, and a sampling signal generator supplying to the control input of the signal sampling circuit an adjustable sampling frequency signal, the sampling signal generator including an oscillator for generating a signal which has a fixed frequency, and a frequency divider switchable between at least two states, in a first state the dividend of the frequency divider being n (n=integer) and in a second state the dividend being k, where $k \geq n+x$, where x is an integer and is $\geq 1$, and wherein the frequency divider has a control input for switching the frequency divider from one state to the other, means connecting the frequency divider control input to an output of a sigma-delta modulator having an input for receiving a control signal for realizing an effective dividend m, where $n \leq m \leq k$.

2. Discrete-time signal processing system as claimed in claim 1, further comprising a phase detector which generates the control signal and has a first input for receiving a further signal having a fixed frequency relation to the sampling frequency signal and a second input for receiving a signal to be sampled by the sampling circuit.

3. Discrete-time signal processing system as claimed in claim 1, further comprising an analog filter coupled between an output of the frequency divider and the control input of the sampling circuit.

4. Discrete-time signal processing system as claimed in claim 3, further comprising a decimation filter connected to an output of the sampling circuit.

5. Discrete-time signal processing system as claimed in claim 3, wherein the input of the sigma-delta modulator is connected to an output of the analog filter.

6. Discrete-time signal processing system as claimed in claim 1 wherein the dividend n is greater than 3 and smaller than 129.

7. Discrete-time signal processing system as claimed in claim 1, wherein the dividend n is greater than 31 and smaller than 65.

8. Discrete-time signal processing system as claimed in claim 3, wherein the analog filter is a bandpass filter.

9. Discrete-time signal processing system as claimed in claim 3, wherein the analog filter comprises a phase locked loop.

10. Discrete-time signal processing system as claimed in claim 2, further comprising an analog filter coupled between an output of the frequency divider and the control input of the sampling circuit.

11. Discrete-time signal processing system as claimed in claim 1, further comprising a decimation filter connected to an output of the sampling circuit.

12. Discrete-time signal processing system as claimed in claim 3, wherein the dividend n is greater than 3 and smaller than 129.

13. Discrete-time signal processing system as claimed in claim 2, wherein said first input of the phase detector is coupled to an output of the frequency divider and the dividend n is greater than 31 and smaller than 65.

14. The discrete-time signal processing system as claimed in claim 1, wherein the input of the sigma-delta modulator is connected to an output of the frequency divider.

15. The discrete-time signal processing system as claimed in claim 10, wherein the sigma-delta modulator, the phase detector and the analog filter are all components of the sampling signal generator.

16. A signal processing system comprising:
a signal sampling circuit having a signal input for receiving a signal to be sampled and a control input for determining the sampling frequency of the signal sampling circuit; and
a sampling signal generator for supplying to the control input of the signal sampling circuit an output control signal having an adjustable frequency, wherein the sampling signal generator comprises an oscillator for generating a stable fixed frequency, a frequency divider having a first state wherein it divides by a factor n, wherein n is an integer, and having a second state wherein it divides by a factor k, where $k \geq n+x$, x being an integer $\geq 1$, said frequency divider being coupled to said oscillator and to said control input of the signal sampling circuit, and a sigma-delta modulator having an input for receiving an input control signal and an output coupled to a control input of the frequency divider for switching the frequency divider between said first and second states so as to derive an effective dividend m, where $n \leq m \leq k$.

17. The signal processing system as claimed in claim 16 further comprising:

a signal processing circuit having an input for receiving a signal to be processed, a first output coupled to said signal input of the signal sampling circuit to supply the signal to be sampled, and a phase detector having a first input coupled to an output of the frequency divider, a second input coupled to a second output of the signal processing circuit, and an output coupled to said input of the sigma-delta modulator for supplying thereto said input control signal.

18. The signal processing system as claimed in claim 16 further comprising an analog filter coupled between an output of the frequency divider and said control input of the signal sampling circuit.

19. The signal processing system as claimed in claim 17 further comprising an analog filter coupled between said output of the frequency divider and said control input of the signal sampling circuit and said first input of the phase detector.

20. The signal processing system as claimed in claim 16 further comprising a band-pass filter coupled between an output of the frequency divider and said control input of the signal sampling circuit, and wherein the frequency divider is alternatively switched between said first and second states under control of the sigma-delta modulator whereby the effecitve dividend m can have a value between n and n+x whereby the sampling frequency is not limited to integer dividends.

21. The signal processing system as claimed in claim 16 further comprising an analog filter coupled between an output of the frequency divider and said control input of the signal sampling circuit, and wherein $k=n+x$ and $x=1$ so that $k=n+1$ and the effective dividend m lies between n and n+1.

* * * * *